United States Patent
Iyengar et al.

(10) Patent No.: US 9,295,182 B2
(45) Date of Patent: Mar. 22, 2016

(54) DUAL COIL WITH ADAPTER TO MOVE BETWEEN REDUNDANT AND NON-REDUNDANT HIGH PERFORMANCE HEAT EXCHANGER

(75) Inventors: Madhusudan K. Iyengar, Woodstock, NY (US); Roger R. Schmidt, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 380 days.

(21) Appl. No.: 13/296,207

(22) Filed: Nov. 14, 2011

(65) Prior Publication Data
US 2013/0118712 A1 May 16, 2013

(51) Int. Cl.
*F28D 15/00* (2006.01)
*B23P 15/26* (2006.01)
*H05K 7/20* (2006.01)
*F28D 21/00* (2006.01)

(52) U.S. Cl.
CPC ........ *H05K 7/20736* (2013.01); *H05K 7/20618* (2013.01); *H05K 7/20781* (2013.01); *F28D 2021/0028* (2013.01); *F28F 2210/04* (2013.01); *Y10T 29/4935* (2015.01)

(58) Field of Classification Search
CPC ............. F25B 41/003; F25B 39/028; F28D 2021/0028; H05K 7/20272; H05K 7/207; H05K 7/20536–7/20836; F28F 2210/04
USPC .............. 62/259.2, 77, 299, 298; 361/679.44, 361/679.43, 679.42, 679.41
See application file for complete search history.

(56) References Cited

U.S. PATENT DOCUMENTS

| | | | | |
|---|---|---|---|---|
| 2,355,289 A * | 8/1944 | Lowell | ............................. | 62/279 |
| 3,392,541 A * | 7/1968 | Nussbaum | ...................... | 62/184 |
| 3,966,673 A * | 6/1976 | Frick et al. | ..................... | 524/788 |
| 4,851,965 A * | 7/1989 | Gabuzda | ............ | H05K 7/20154 |
| | | | | 165/908 |
| 4,949,218 A * | 8/1990 | Blanchard | .............. | H05K 7/206 |
| | | | | 165/104.33 |
| 6,181,557 B1 * | 1/2001 | Gatti | .................. | H05K 7/20618 |
| | | | | 165/122 |
| 6,819,563 B1 * | 11/2004 | Chu et al. | ....................... | 361/696 |
| 6,955,055 B2 * | 10/2005 | Ebermann | ........................ | 62/3.6 |
| 7,434,412 B1 * | 10/2008 | Miyahira | ......................... | 62/115 |
| 7,477,514 B2 * | 1/2009 | Campbell et al. | ............. | 361/699 |
| 7,646,603 B2 | 1/2010 | Bard et al. | ..................... | 361/696 |
| 7,791,882 B2 * | 9/2010 | Chu et al. | ....................... | 361/698 |
| 8,789,384 B2 * | 7/2014 | Eckberg et al. | .............. | 62/259.2 |
| 8,789,394 B2 * | 7/2014 | Tatsumi et al. | ................. | 66/174 |
| 2002/0035845 A1 * | 3/2002 | Smolinsky | ................... | 62/324.1 |
| 2005/0235671 A1 | 10/2005 | Belady et al. | ................ | 62/259.2 |
| 2005/0241802 A1 | 11/2005 | Malone et al. | ............... | 165/80.4 |
| 2005/0242580 A1 * | 11/2005 | Mancinelli et al. | ........... | 285/305 |

(Continued)

*Primary Examiner* — Cassey D Bauer
*Assistant Examiner* — Kirstin Oswald
(74) *Attorney, Agent, or Firm* — Margaret A. McNamara; Ido Tuchman (57) ABSTRACT

An apparatus, rear door heat exchanger, system, and method for controlling the redundancy of a cooling system for a server rack. The system includes a cooling system having at least two liquid cooling circuits. The system also includes a rear door heat exchanger connected to the cooling system. The rear door heat exchanger includes two heat exchange coils. Each heat exchange coil is carried by the server rack and configured to interface with a different liquid cooling circuit. The rear door heat exchanger also includes an adapter configured to couple together the two heat exchange coils into one heat exchange unit. The heat exchange unit is configured to interface with one liquid cooling circuit from the cooling system.

17 Claims, 6 Drawing Sheets

(56) References Cited

U.S. PATENT DOCUMENTS

| | | | |
|---|---|---|---|
| 2007/0159797 A1 | 7/2007 | Teneketges et al. | 361/699 |
| 2007/0215215 A1* | 9/2007 | Arentsen et al. | 137/496 |
| 2008/0011463 A1* | 1/2008 | Timbs et al. | 165/151 |
| 2008/0093054 A1* | 4/2008 | Tilton | H05K 7/20681 |
| | | | 165/104.21 |
| 2008/0094797 A1 | 4/2008 | Coglitore et al. | 361/687 |
| 2008/0158815 A1* | 7/2008 | Campbell et al. | 361/696 |
| 2008/0158818 A1 | 7/2008 | Clidaras et al. | 361/699 |
| 2008/0266726 A1 | 10/2008 | Murakami et al. | 361/1 |
| 2009/0056910 A1 | 3/2009 | Mallia et al. | 165/80.3 |
| 2009/0126909 A1 | 5/2009 | Ellsworth, Jr. et al. | 165/104.33 |
| 2009/0268404 A1* | 10/2009 | Chu et al. | 361/696 |
| 2011/0232889 A1* | 9/2011 | Eckberg et al. | 165/200 |

\* cited by examiner

DUAL COIL WITH ADAPTER TO MOVE BETWEEN REDUNDANT AND NON-REDUNDANT HIGH PERFORMANCE HEAT EXCHANGER

BACKGROUND

The present invention is directed towards the cooling of server racks with liquid heat exchanging devices, and more particularly to the use of a redundant liquid cooling system for server racks.

Modern electronic devices continue to grow smaller and denser to optimize speed and minimize power requirements. With the increase of electronic communication and the spread of networks, data centers have been developed to centralize management of network devices. Data centers often include server racks, which contain multiple servers in one storage unit. Servers in each server rack produce heat that may be carried away from the data center by air flow through the server rack. The heat carried in the air flow may increase the temperature of the data center. A variety of cooling techniques can be implemented to maintain cooler temperatures in the data center.

BRIEF SUMMARY

An example embodiment of the present invention is an apparatus for controlling the redundancy of a cooling system for a server rack. The apparatus includes an adapter configured to couple together two heat exchange coils into one heat exchange unit. The heat exchange unit is configured to interface with one liquid cooling circuit. Each heat exchange coil is carried by the server rack and configured to interface with a different liquid cooling circuit.

Another example embodiment of the present invention is a rear door heat exchanger for controlling the redundancy of a cooling system for a server rack. The rear door heat exchanger includes two heat exchange coils. Each heat exchange coil is carried by the server rack and configured to interface with a different liquid cooling circuit. The rear door heat exchanger also includes an adapter configured to couple together the two heat exchange coils into one heat exchange unit. The heat exchange unit is configured to interface with one liquid cooling circuit.

Another example embodiment of the invention is a system for cooling air flow through a server rack. The system includes a cooling system having at least two liquid cooling circuits. The system also includes a rear door heat exchanger connected to the cooling system. The rear door heat exchanger includes two heat exchange coils. Each heat exchange coil is carried by the server rack and configured to interface with a different liquid cooling circuit. The rear door heat exchanger also includes an adapter configured to couple together the two heat exchange coils into one heat exchange unit. The heat exchange unit is configured to interface with one liquid cooling circuit from the cooling system.

Yet another example embodiment of the invention is a method of controlling the redundancy of a cooling system for a server rack. The method includes coupling by an adapter two heat exchange coils. Each heat exchange coil is carried by the server rack and configured to interface with a different liquid cooling circuit. The adapter couples the two heat exchange coils such that the two heat exchange coils become one heat exchange unit. The heat exchange unit is configured to interface with one liquid cooling circuit.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-6. As discussed in detail below, embodiments of the present invention include an apparatus, rear door heat exchanger, system, and method for controlling the redundancy of a cooling system for a server rack.

Figure 1:
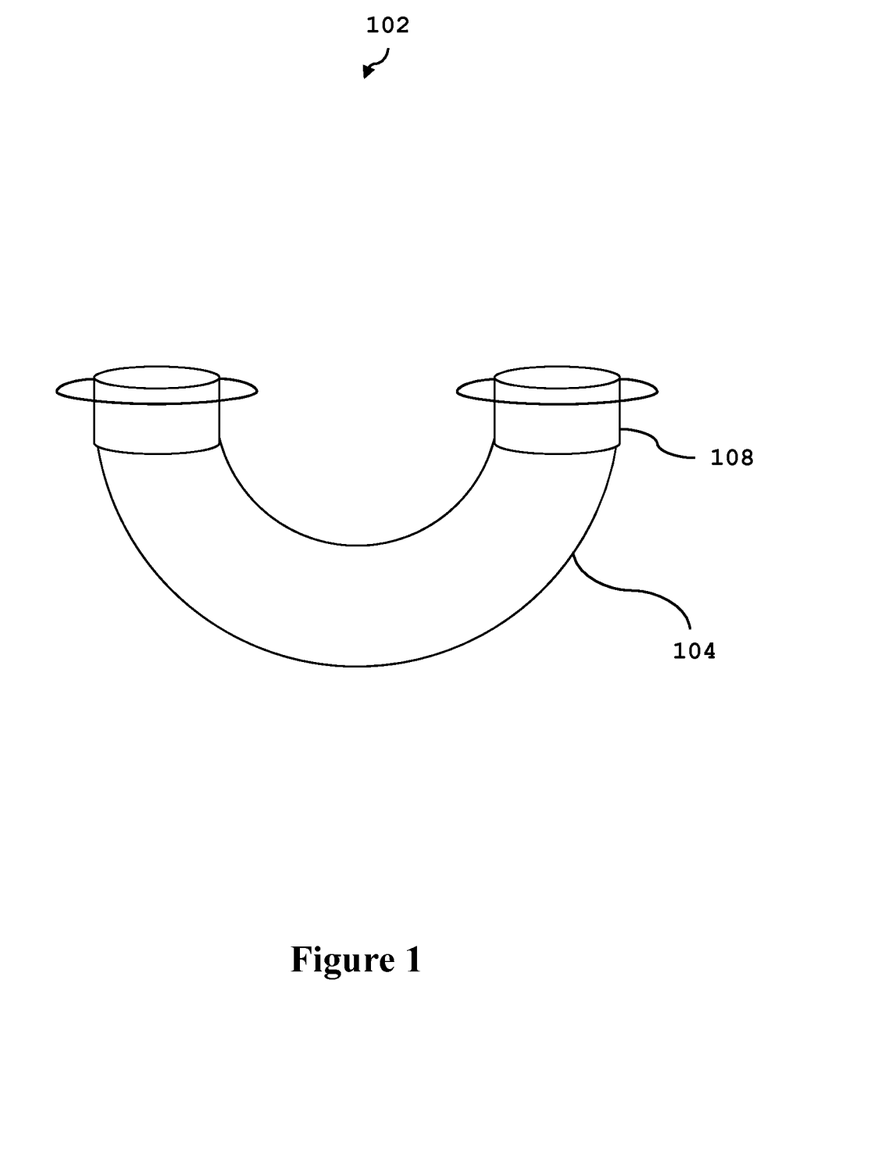
FIG. 1 shows an example embodiment of an apparatus for controlling the redundancy of a cooling system for a server rack.

FIG. 1 shows an example embodiment of an apparatus 102 for controlling the redundancy of a cooling system for a server rack. The apparatus 102 may include an adapter 104 configured to couple together two heat exchange coils into one heat exchange unit. In one embodiment, the adapter 104 is adjustable such that the two heat exchange coils can be uncoupled. In one embodiment, the adapter 104 includes quick connect fittings 108 for coupling and uncoupling the adapter 104 to the heat exchange coils. The adapter, heat exchange coils, heat exchange unit, and cooling system are further described below.

Figure 2:
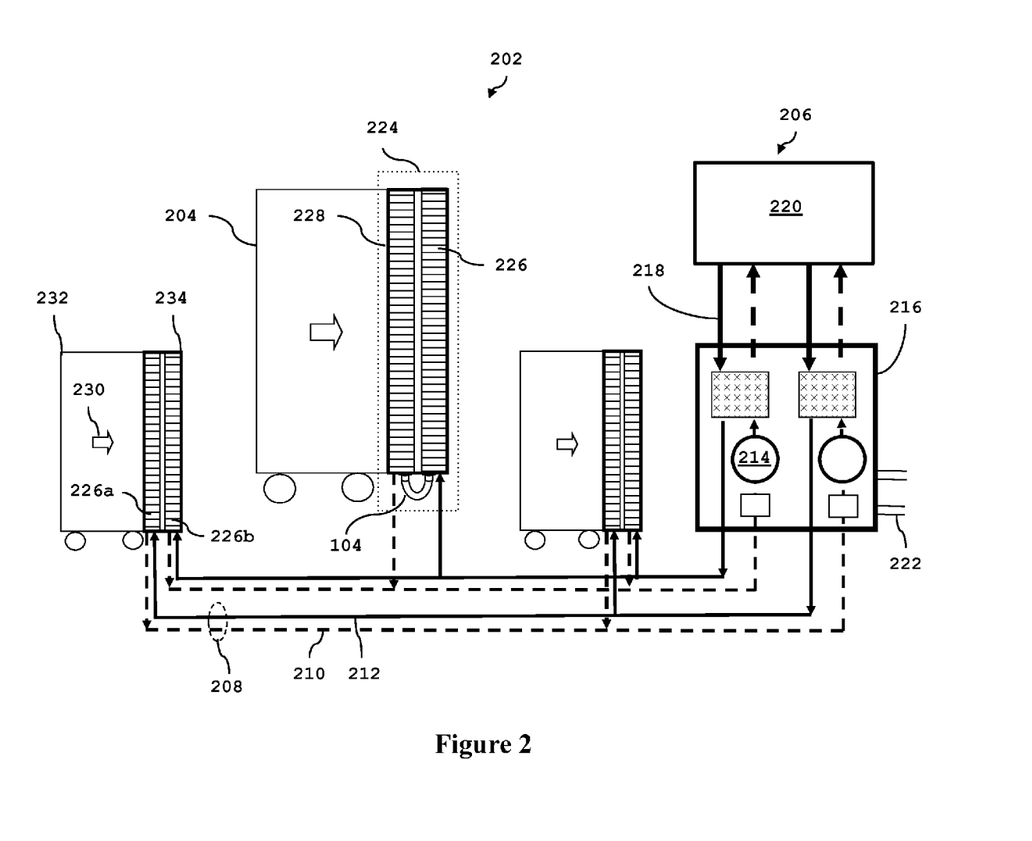
FIG. 2 shows an example embodiment of a system for cooling air flow through a server rack.

FIG. 2 shows an example embodiment of a system 202 for cooling air flow through a server rack 204. In one embodiment, the system 202 includes a cooling system 206 having at least two liquid cooling circuits 208. In one embodiment, the cooling system includes a plurality of server racks 204. The cooling system 206 may include coolant supplied to the plurality of server racks 204 from the liquid cooling circuits 208. Each liquid cooling circuit may include two coolant lines 210 and 212. The first coolant line 210 may receive coolant from the plurality of server racks 204 and the second coolant line 212 may supply coolant to the plurality of server racks 204. In one embodiment, each liquid cooling circuit 208 includes a coolant pump 214. The coolant pump 214 may be enclosed within a coolant distribution unit 216. Furthermore, each coolant pump 214 may also couple to a chiller supply line 218 from a chiller plant 220. Further still, each coolant pump 214 may couple to an independent power supply line 222.

The system 202 may include a rear door heat exchanger (RDHx) 224 connected to the cooling system 206. In one embodiment, the rear door heat exchanger 224 includes two heat exchange coils 226. For example, the rear door heat exchanger 224 may be a dual coil RDHx packaged in a monolithic assembly. In one embodiment, at least one of the two heat exchange coils 226 includes a set of horizontal tubes coupled to a set of vertical air cooling fins. Each heat exchange coil 226 may be carried by the server rack 204 and configured to interface with a different liquid cooling circuit 208. In one embodiment, the system 202 includes an adapter 104 configured to couple together the two heat exchange coils 226 into one heat exchange unit 228. The heat exchange unit 228 may be configured to interface with one liquid cooling circuit 208 from the cooling system 206. The adapter 104 may be used, for example, if a data center does not require the redundancy offered by a dual coil RDHx or is not equipped with more than one liquid cooling circuit 208. The adapter 104 may be provided to convert a dual coil RDHx to a non-redundant RDHx. The adapter 104 may also be used if there is a failure along one of the liquid coolant circuits 208, or if one of the two heat exchange coils 226 fails. In such cases, the redundancy in the system 202 may ensure the server rack's 204 exhaust air will continue to be cooled. The adapter 104 is described in further detail above. In one embodiment, one of the two heat exchange coils 226b is positioned after the other heat exchange coil 226a in a direction 230 from a front 232 of the server rack to a rear 234 of the server rack.

Figure 3:
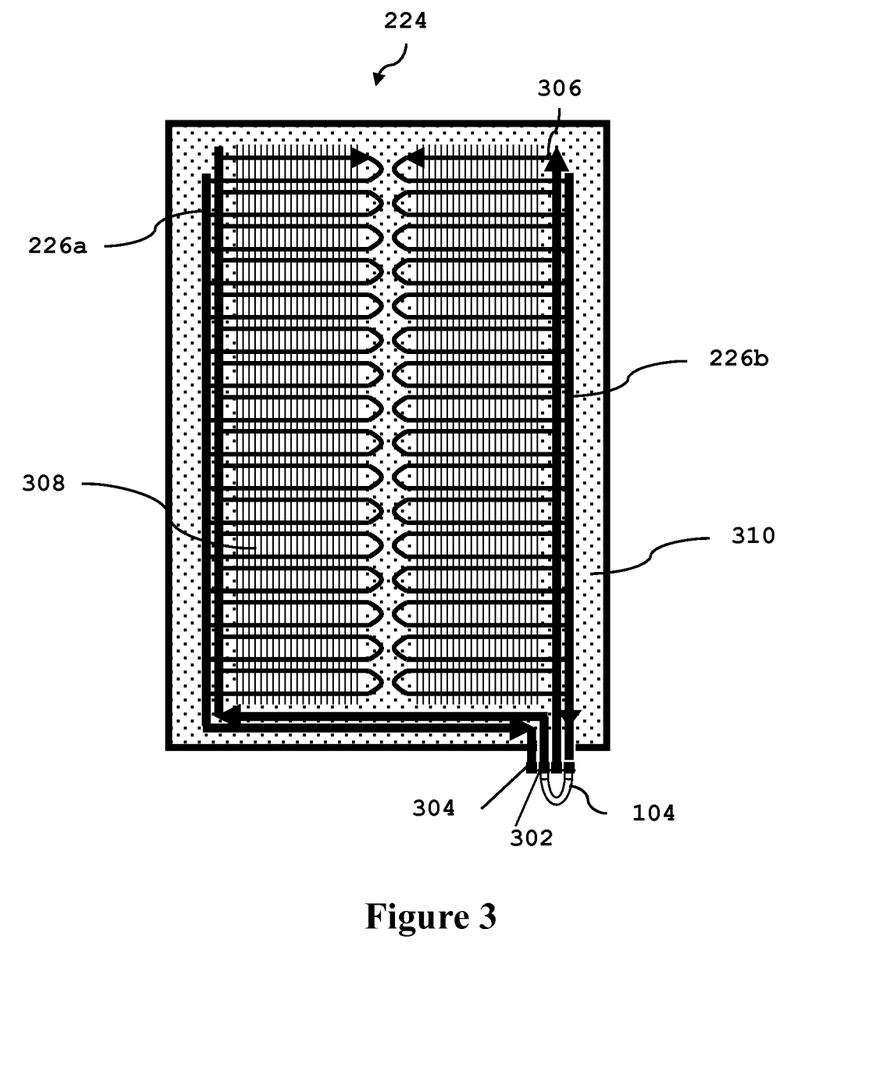
FIG. 3 shows an example embodiment of two heat exchange coils positioned side-by-side.

FIG. 3 shows an example embodiment of two heat exchange coils 226. The two heat exchange coils 226 may be positioned side-by-side in a plane perpendicular to a direction (into the page as shown from the perspective of FIG. 3) from a front door of the server rack to a rear door of the server rack. The two exchange coils 226 each may be substantially half of a width of the server rack.

In one embodiment, each of the two heat exchange coils 226 includes a liquid intake port 302 to receive liquid into the heat exchange coil 226 and a liquid exit port 304 to send liquid out of the heat exchange coil 226. The adapter 104 may be configured to couple together the liquid intake port 302 of one heat exchange coil 226a and the liquid intake port 302 of the other heat exchange coil 226b, the liquid exit port 304 of one heat exchange coil 226a and the liquid exit port 304 of the other heat exchange coil 226b, or the liquid exit port 304 of one of the two heat exchange coils 226a and the liquid intake port 302 of the other heat exchange coil 226b. In one embodiment, the liquid intake port 302 and liquid exit port 304 both include quick connect fittings. The adapter 104 may also include quick connect fittings to interface with the liquid intake port 302 and liquid exit port 304. In one embodiment, at least one of the two heat exchange coils includes a set of horizontal tubes 306 coupled to a set of vertical air cooling fins 308.

The two heat exchange coils 226 may be proximate an air filter 310 configured to force cabinet exhaust air through vertical air cooling fins 308. The air filter 310 can therefore be used to prevent exhaust air from bypassing the two heat exchange coils 226. The air filter 310 may be constructed from, for example, plastic, foam material, and/or sheet metal.

Figure 4:
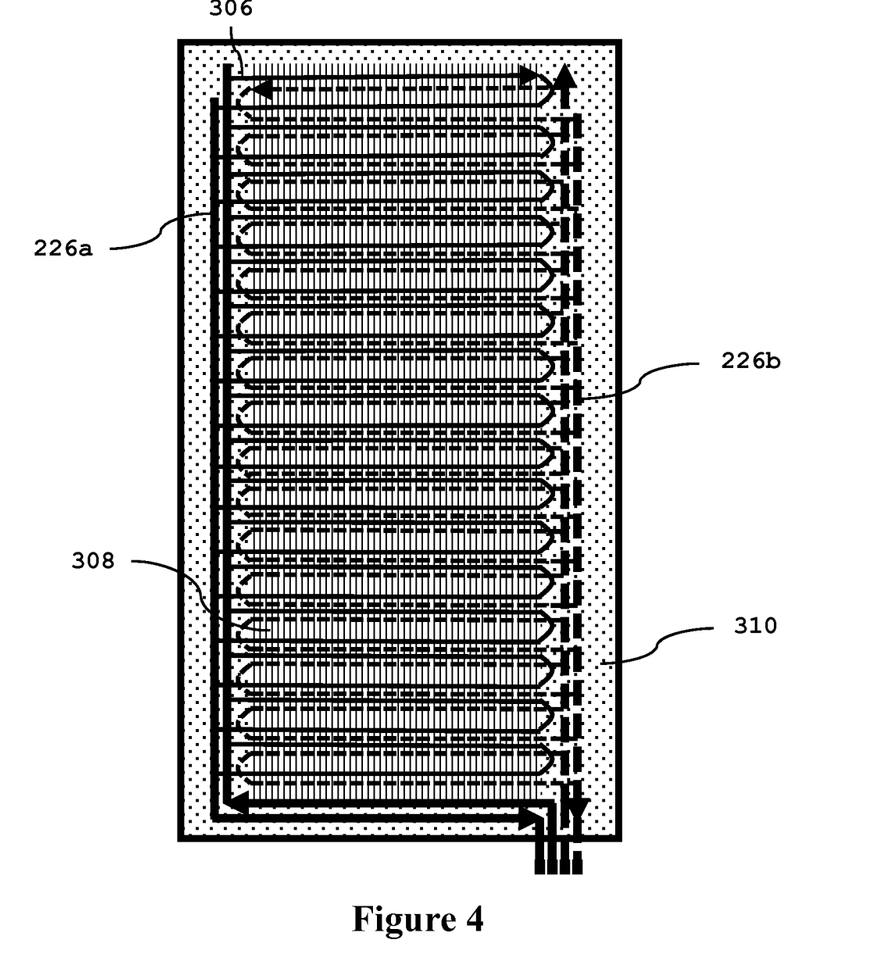
FIG. 4 shows an example embodiment of two heat exchange coils intertwined.

FIG. 4 shows another example embodiment of two heat exchange coils 226. In one embodiment, at least one of the two heat exchange coils 226 includes a set of horizontal tubes 306 coupled to a set of vertical air cooling fins 308. The two heat exchange coils 226 may be proximate an air filter 310 as described above. The two heat exchange coils 226 may be intertwined with each other by staggering one heat exchange coil 226a with the other heat exchange coil 226b.

Figure 5:
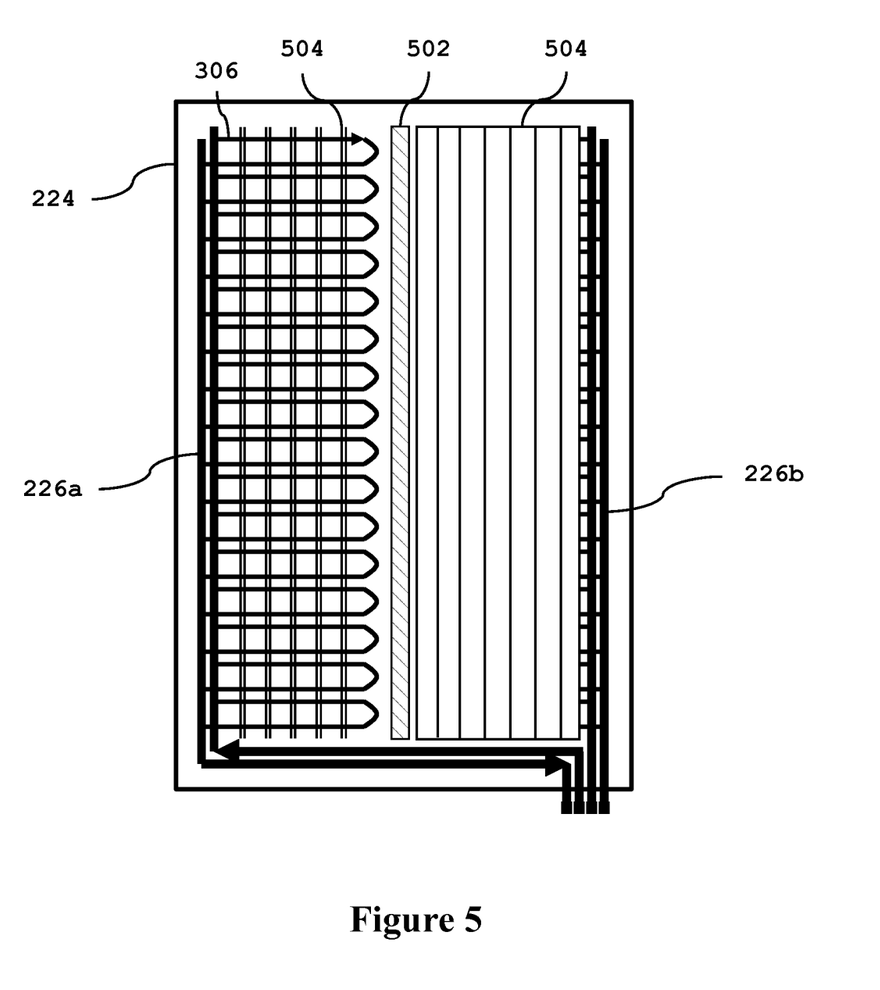
FIG. 5 shows an example embodiment of a rear door heat exchanger with a cooling failure.

FIG. 5 shows an example embodiment of a rear door heat exchanger 224 with a cooling failure. In one embodiment, the rear door heat exchanger 224 includes an isolation device 502 configured to thermally isolate one heat exchange coil 226b from the other heat exchange coil 226a. In one embodiment, the rear door heat exchanger 224 includes an air flow diversion device 504 configured to divert an air flow through the server rack away from the one heat exchange coil 226b towards the other heat exchange coil 226a. In one embodiment, the air flow diversion device 504 is a set of louvers. The louvers may be in a closed position, as shown covering heat exchange coil 226b, or in an open position, as shown partially in front of heat exchange coil 226a. The closed louvers may act as an air barrier, diverting exhaust air from the malfunctioning heat exchange coil 226b with the cooling failure to the functioning heat exchange coil 226a. In one embodiment, the isolation device 502 and air flow diversion device 504 are embodied in a solid flap configured to block and isolate one heat exchange coil and force the flow of all of the exhaust air through the other heat exchange coil.

Though not completely shown in FIG. 5, it is understood that at least one of the two heat exchange coils 226 may include a set of horizontal tubes 306 coupled to a set of vertical air cooling fins. Additionally, it is noted that the two heat exchange coils 226 may be proximate an air filter. These elements, though not shown in FIG. 5 for the sake of maintaining discernability, are described above.

Figure 6:
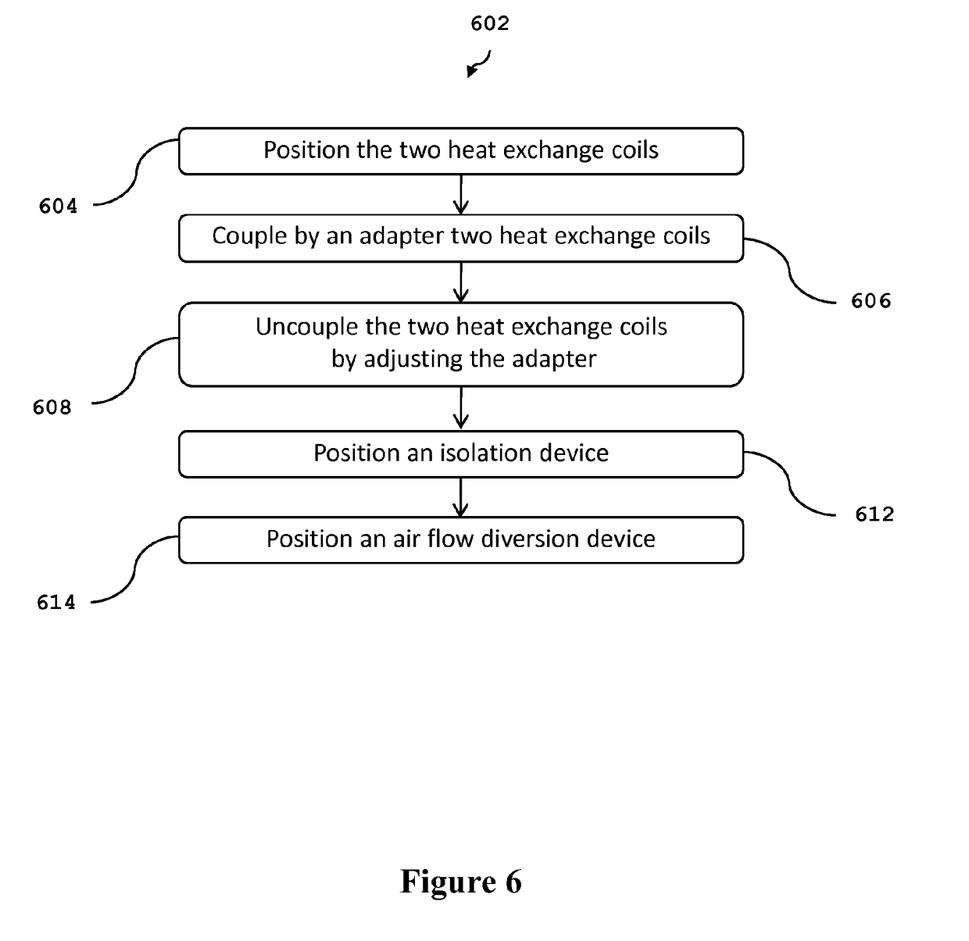
FIG. 6 shows an example embodiment of a method of controlling the redundancy of a cooling system for a server rack.

FIG. 6 shows an example embodiment of a method 602 of controlling the redundancy of a cooling system for a server rack. The method 602 may include a coil positioning step 604. In one embodiment, the coil positioning step 604 includes positioning one of two heat exchange coils after the other heat exchange coil in a direction from a front of a server rack to a rear of a server rack. In another embodiment, the coil positioning step 604 includes positioning the two heat exchange coils side-by-side in a plane perpendicular to a direction from a front door of the server rack to a rear door of the server rack. The two exchange coils each may be substantially half of a width of the server rack. In yet another embodiment, the coil positioning step 604 includes intertwining the two heat exchange coils with each other by staggering one heat exchange coil with the other heat exchange coil. The two exchange coils may be part of a rear door heat exchanger described in further detail above.

The method 602 may include a coupling step 606 of coupling by an adapter two heat exchange coils. In one embodiment, the two heat exchange coils are coupled such that the two heat exchange coils become one heat exchange unit configured to interface with one liquid cooling circuit. Each of the two heat exchange coils may include a liquid intake port to receive liquid into the heat exchange coil and a liquid exit port to send liquid out of the heat exchange coil. In one embodiment, the coupling step 606 includes coupling together by the adapter the liquid intake port of one heat exchange coil and the liquid intake port of the other heat exchange coil, the liquid exit port of one heat exchange coil and the liquid exit port of the other heat exchange coil, or the liquid exit port of one heat exchange coil and the liquid intake port of the other heat exchange coil. The adapter is described in greater detail above.

In one embodiment, method 602 includes an uncoupling step 608 of uncoupling the two heat exchange coils by adjusting the adapter. In one embodiment, the adapter and heat exchange coils include quick connect fittings. Uncoupling and coupling may be performed by actuating the quick connect fittings. In one embodiment, at least one of the two heat exchange coils includes a set of horizontal tubes coupled to a set of vertical air cooling fins.

In one embodiment, method 602 includes a heat exchange coil isolation step 612 of positioning an isolation device to isolate one heat exchange coil from the other heat exchange coil. Method 602 may also include an air flow diversion step 614 of positioning an air flow diversion device to divert air flow through the server rack away from one heat exchange coil towards the other heat exchange coil. The isolation device and air flow diversion device are described further above.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. An apparatus for controlling the redundancy of a cooling system for a server rack, the apparatus comprising:
    a single rear door heat exchanger;
    a first heat exchange coil and a second heat exchange coil, each heat exchange coil carried by the server rack and configured to interface with a different liquid cooling circuit;
    a first set of louvers adjustable to a closed position and an open position, the first set of louvers, in the closed position, configured to divert an air flow through the server rack away from the first heat exchange coil toward the second heat exchange coil;
    a second set of louvers adjustable to the closed position and the open position, the second set of louvers, in the closed position, configured to divert the air flow through the server rack away from the second heat exchange coil toward the first heat exchange coil; and
    an adapter configured to couple together the first and second heat exchange coils into one heat exchange unit, the heat exchange unit configured to interface with one liquid cooling circuit.

2. The apparatus of claim 1, wherein the adapter is adjustable such that the first and second heat exchange coils can be uncoupled.

3. The apparatus of claim 1, wherein the adapter is configured to couple together at least one of:
    a liquid intake port of the first heat exchange coil and a liquid intake port of the second heat exchange coil;
    a liquid exit port of the first heat exchange coil and a liquid exit port of the second heat exchange coil; and the liquid exit port of the first heat exchange coil and the liquid intake port of the second heat exchange coil.

4. The apparatus of claim 1, wherein at least one of the first and second heat exchange coils includes a set of horizontal tubes coupled to a set of vertical air cooling fins.

5. The apparatus of claim 1, further comprising:
    an isolation device configured to thermally isolate the first heat exchange coil from the second heat exchange coil.

6. A system for cooling air flow through a server rack, the system comprising:
    a cooling system having at least two liquid cooling circuits; and
    a single rear door heat exchanger connected to the cooling system, the rear door heat exchanger including:
        a first heat exchange coil and a second heat exchange coil, each of the first and second heat exchange coils carried by the server rack and configured to interface with a different liquid cooling circuit;
        a first set of louvers adjustable to a closed position and an open position, the first set of louvers, in the closed position, configured to divert an air flow through the server rack away from the first heat exchange coil toward the second heat exchange coil;
        a second set of louvers adjustable to the closed position and the open position, the second set of louvers, in the closed position, configured to divert the air flow through the server rack away from the second heat exchange coil toward the first heat exchange coil; and
        an adapter configured to couple together the first and second heat exchange coils into one heat exchange unit configured to interface with one liquid cooling circuit from the cooling system.

7. The system of claim 6, wherein the adapter is adjustable such that the first and second heat exchange coils can be uncoupled.

8. The system of claim 6, wherein the adapter is configured to couple together at least one of:
    a liquid intake port of the first heat exchange coil and a liquid intake port of the second heat exchange coil;
    a liquid exit port of the first heat exchange coil and a liquid exit port of the second heat exchange coil;
    and the liquid exit port of the first heat exchange coil and the liquid intake port of the second heat exchange coil.

9. The system of claim 6, wherein at least one of the first and second heat exchange coils includes a set of horizontal tubes coupled to a set of vertical air cooling fins.

10. The system of claim 6, wherein the first and second heat exchange coils are positioned side-by-side in a plane perpendicular to a direction from a front door of the server rack to a rear door of the server rack, each of the first and second exchange coils each being substantially half of a width of the server rack.

11. A method of controlling the redundancy of a cooling system for a server rack, comprising:
    positioning a single rear door heat exchanger at a side of the server rack from which cooling air exits;
    coupling by an adapter first and second heat exchange coils in the single rear door heat exchanger, each of the first and second heat exchange coils carried by the server rack and configured to interface with a different liquid cooling circuit, such that the first and second heat exchange coils become one heat exchange unit configured to interface with one liquid cooling circuit;
    operating a first set of louvers adjustable to a closed position and an open position, the first set of louvers, in the closed position, configured to divert an air flow through the server rack away from the first heat exchange coil toward the second heat exchange coil;
    operating a second set of louvers adjustable to the closed position and the open position, the second set of louvers, in the closed position, configured to divert the air flow through the server rack away from the second heat exchange coil toward the first heat exchange coil.

12. The method of claim 11, further comprising:
    uncoupling the first and second heat exchange coils by adjusting the adapter.

13. The method of claim 11, wherein each of the first and second heat exchange coils includes a liquid intake port to receive liquid into the heat exchange coil and a liquid exit port to send liquid out of the heat exchange coil, the method further comprising:
    coupling together by the adapter at least one of the liquid intake port of the first heat exchange coil and the liquid intake port of the second heat exchange coil, the liquid exit port of the first heat exchange coil and the liquid exit port of the second heat exchange coil, and the liquid exit port of the first heat exchange coil and the liquid intake port of the second heat exchange coil.

14. The method of claim 11, wherein at least one of the first and second heat exchange coils includes a set of horizontal tubes coupled to a set of vertical air cooling fins.

15. The method of claim 11, further comprising:
    positioning an isolation device to isolate the first heat exchange coil from the second heat exchange coil.

16. The apparatus claim 1, wherein the rear door heat exchanger is positioned at a side of the server rack from which cooling air exits.

17. The system claim 6, wherein the rear door heat exchanger is positioned at a side of the server rack from which cooling air exits.

* * * * *